(12) United States Patent
Yoon et al.

(10) Patent No.: US 10,147,352 B2
(45) Date of Patent: Dec. 4, 2018

(54) THIN FILM TRANSISTOR SUBSTRATE AND ORGANIC LIGHT-EMITTING DIODE DISPLAY APPARATUS

(71) Applicant: SAMSUNG DISPLAY CO., LTD., Yongin-si, Gyeonggi-Do (KR)

(72) Inventors: Juwon Yoon, Yongin-si (KR); Sewan Son, Yongin-si (KR); Iljeong Lee, Yongin-si (KR); Jiseon Lee, Yongin-si (KR); Deukmyung Ji, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 295 days.

(21) Appl. No.: 15/004,472

(22) Filed: Jan. 22, 2016

(65) Prior Publication Data

US 2016/0379562 A1 Dec. 29, 2016

(30) Foreign Application Priority Data

Jun. 25, 2015 (KR) ........................ 10-2015-0090494

(51) Int. Cl.
*G09G 3/3233* (2016.01)
*H01L 29/786* (2006.01)
*H01L 29/423* (2006.01)

(52) U.S. Cl.
CPC ..... *G09G 3/3233* (2013.01); *H01L 29/42384* (2013.01); *H01L 29/78645* (2013.01);

(Continued)

(58) Field of Classification Search
CPC ........ H01L 29/78645; H01L 29/78648; G09G 3/3233
See application file for complete search history.

(56) References Cited

U.S. PATENT DOCUMENTS

| 9,424,781 B2 * | 8/2016 | Park ..................... G09G 3/3291 |
| 2006/0066512 A1 * | 3/2006 | Afentakis ................ G09G 3/20 345/55 |

(Continued)

FOREIGN PATENT DOCUMENTS

| KR | 1020060038334 | 4/2006 |
| KR | 1020060118063 | 11/2006 |

(Continued)

*Primary Examiner* — Amr Awad
*Assistant Examiner* — Stephen Bray
(74) *Attorney, Agent, or Firm* — F. Chau & Associates, LLC

(57) ABSTRACT

An organic light-emitting diode (OLED) display apparatus is provided. The OLED display apparatus includes a substrate, an initialization voltage line, a first thin film transistor (TFT) including an active layer. The initialization voltage line transmits an initialization voltage. The first thin film transistor (TFT) includes an active layer, a gate electrode, and an auxiliary gate electrode. The active layer is disposed on the substrate and includes a source region, a channel region, and a drain region. The gate electrode is disposed on the channel region. The auxiliary gate electrode is disposed on the gate electrode on a boundary between the channel region and the drain region. The voltage application electrode is disposed on the auxiliary gate electrode and is connected to the initialization voltage line and the auxiliary gate electrode.

20 Claims, 6 Drawing Sheets

(52) U.S. Cl.
CPC ............... *G09G 2300/0819* (2013.01); *G09G 2300/0842* (2013.01); *G09G 2300/0861* (2013.01); *G09G 2300/0866* (2013.01); *G09G 2320/0214* (2013.01)

(56) References Cited

U.S. PATENT DOCUMENTS

| | | |
|---|---|---|
| 2007/0235803 A1 | 10/2007 | Shin et al. |
| 2007/0252207 A1 | 11/2007 | Park et al. |
| 2011/0050604 A1 | 3/2011 | Kwon et al. |
| 2011/0084262 A1* | 4/2011 | Kondratyuk ...... H01L 29/78645 257/43 |
| 2012/0153289 A1* | 6/2012 | Kaneko ............. H01L 29/78633 257/59 |
| 2014/0034923 A1* | 2/2014 | Kim ................... H01L 27/3297 257/40 |
| 2014/0070184 A1 | 3/2014 | Shin |

FOREIGN PATENT DOCUMENTS

| | | |
|---|---|---|
| KR | 10-0763913 | 9/2007 |
| KR | 1020070101033 | 10/2007 |
| KR | 1020120093800 | 8/2012 |
| KR | 1020140035156 | 3/2014 |

\* cited by examiner

THIN FILM TRANSISTOR SUBSTRATE AND ORGANIC LIGHT-EMITTING DIODE DISPLAY APPARATUS

CROSS-REFERENCE TO RELATED APPLICATION

This application claims priority under 35 U.S.C. § 119 to Korean Patent Application No. 10-2015-0090494, filed on Jun. 25, 2015, in the Korean Intellectual Property Office, the disclosure of which is incorporated by reference herein in its entirety.

TECHNICAL FIELD

Exemplary embodiments of the present invention relate to a thin film transistor (TFT) substrate and an organic light-emitting diode (OLED) display apparatus.

DISCUSSION OF RELATED ART

An organic light-emitting diode (OLED) display apparatus may include two electrodes and an organic light-emitting layer disposed between the two electrodes. Electrons injected from one of the two electrodes and holes injected from the other of the two electrodes may be combined in the organic light-emitting layer to form excitons that may release energy and emit light.

The OLED display apparatus may include a plurality of pixels, each of which may include an OLED that is a spontaneous light-emitting device, and each pixel may include a plurality of TFTs for driving the OLED and at least one capacitor. The plurality of TFTs may include a switching transistor and a driving transistor.

When an off-leakage current is leaked when the switching transistor is in an off-state an OLED display apparatus which is not displaying an image may emit a relatively small amount of light.

SUMMARY

One or more exemplary embodiments of the present invention may include a thin film transistor (TFT) substrate including a TFT in which an off-leakage current is reduced or eliminated.

One or more exemplary embodiments of the present invention may include an organic light-emitting diode (OLED) display apparatus including the TFT substrate.

According to one or more exemplary embodiments of the present invention, an organic light-emitting diode (OLED) display apparatus includes a substrate, an initialization voltage line, a first thin film transistor (TFT) including an active layer. The initialization voltage line transmits an initialization voltage. The first thin film transistor (TFT) includes an active layer, a gate electrode, and an auxiliary gate electrode. The active layer is disposed on the substrate and includes a source region, a channel region, and a drain region. The gate electrode is disposed on the channel region. The auxiliary gate electrode is disposed on the gate electrode on a boundary between the channel region and the drain region. The voltage application electrode is disposed on the auxiliary gate electrode and is connected to the initialization voltage line and the auxiliary gate electrode.

The auxiliary gate electrode need not be disposed on a boundary between the channel region and the source region.

The first TFT may include a p-type transistor, and the initialization voltage may have a negative direct current (DC) voltage level.

The OLED display apparatus may include a first gate insulating film that insulates the active layer and the gate electrode from each other. The first gate insulating film may be disposed between the active layer and the gate electrode. A second gate insulating film may insulate the gate electrode and the auxiliary gate electrode from each other. The second gate insulating film may be disposed between the gate electrode and the auxiliary gate electrode. An interlayer insulating film may be disposed between the auxiliary gate electrode and the voltage application electrode. A first contact plug connecting the auxiliary gate electrode to the voltage application electrode may be disposed in the interlayer insulating film.

The OLED display apparatus may include a scan line that transmits a scan signal. A data line and a driving voltage line may intersect the scan line. The data line may transmit a data signal and the driving voltage line may transmit a driving voltage. A switching TFT may be connected to the scan line and the data line. A driving TFT may include a source connected to a drain of the switching TFT, a gate connected to the source region of the first TFT, and a drain connected to the drain region of the first TFT. A storage capacitor may include a lower electrode connected to the gate of the driving TFT and an upper electrode connected to the driving voltage line.

The driving TFT may be disposed between the first gate insulating film and the second gate insulating film. The driving TFT may include a driving gate electrode functioning as the gate of the driving TFT and the lower electrode of the storage capacitor.

The lower electrode may be disposed between the first gate insulating film and the second gate insulating film. The upper electrode may be disposed between the second gate insulating film and the interlayer insulating film.

The gate electrode of the first TFT may be connected to the scan line. The first TFT may be turned on in response to the scan signal. The first TFT may compensate for a threshold voltage of the driving TFT.

The OLED display apparatus may include an initialization TFT that is turned on in response to a previous scan signal transmitted via a previous scan line. The initialization TFT may transmits the initialization voltage to the gate of the driving TFT.

The OLED display apparatus may include an OLED connected to the drain of the driving TFT. The OLED may emit light in response to a driving current output from the driving TFT. An operation control TFT may be turned on in response to an emission control signal transmitted via an emission control line. The operation control TFT may transmit the driving voltage to the driving TFT. An emission control TFT may be turned on in response to the emission control signal. The emission control TFT may transmit the driving current from the driving TFT to the OLED.

The OLED display apparatus may include a bypass TFT that is turned on in response to a bypass control signal transmitted via a bypass control line. The bypass control line may transmit the initialization voltage to an anode of the OLED.

The initialization voltage line may intersect the scan line. The initialization voltage line may be disposed in the same layer as the data line and the driving voltage line.

According to one or more exemplary embodiments of the present invention, a thin film transistor (TFT) substrate includes a substrate and an active layer disposed on the substrate and including a source region, a channel region, and a drain region. A gate electrode is disposed on the channel region. An auxiliary gate electrode is disposed on the gate electrode on a boundary between the channel region and the drain region. A voltage application electrode is disposed on the auxiliary gate electrode and is connected to the auxiliary gate electrode. The voltage application electrode receives an initialization voltage.

The TFT substrate may include a first gate insulating film that insulates the active layer and the gate electrode from each other. The first gate insulating film may be disposed between the active layer and the gate electrode. A second gate insulating film that insulates the gate electrode and the auxiliary gate electrode from each other. The second gate insulating film may be disposed between the gate electrode and the auxiliary gate electrode. An interlayer insulating film may be disposed between the auxiliary gate electrode and the voltage application electrode. The auxiliary gate electrode may be connected to the voltage application electrode through a first contact plug disposed in the interlayer insulating film.

The TFT substrate may include a source electrode disposed on the interlayer insulating film. The source electrode may be connected to the source region through a second contact plug disposed in the first gate insulating film, the second gate insulating film and the interlayer insulating film. A drain electrode may be disposed on the interlayer insulating film. The drain electrode may be connected to the drain region through a third contact plug disposed in the first gate insulating film, the second gate insulating film and the interlayer insulating film. The source electrode, the drain electrode, and the voltage application electrode may include a same material.

The auxiliary gate electrode need not be disposed on a boundary between the channel region and the source region.

The initialization voltage may have a negative direct current (DC) voltage level. The source region and the drain region may include p-type impurities.

According to one or more exemplary embodiments of the present invention, an organic light-emitting diode (OLED) display apparatus includes a substrate. A scan line transmits a scan signal. An initialization voltage line transmits an initialization voltage. A data line and a driving voltage line transmit a data signal and a driving voltage, respectively. A switching thin film transistor (TFT) is connected to the scan line and the data line. A driving TFT is connected to the switching TFT. A compensation TFT is connected between a gate of the driving TFT and a drain of the driving TFT. The compensation TFT is turned on in response to the scan signal. The compensation TFT compensate for a threshold voltage of the driving TFT. An OLED is connected to the driving TFT. The compensation TFT includes an active layer disposed on the substrate and includes a source region, a channel region, and a drain region. A gate electrode is disposed on the channel region. An auxiliary gate electrode is disposed on the gate electrode and is connected to the initialization voltage line. The auxiliary gate electrode is disposed on a boundary between the channel region and the drain region.

The OLED display apparatus may include a first gate insulating film that insulates the active layer and the gate electrode from each other. The first gate insulating film may be disposed between the active layer and the gate electrode. A second gate insulating film may insulate the gate electrode and the auxiliary gate electrode from each other. The second gate insulating film may be disposed between the gate electrode and the auxiliary gate electrode. An interlayer insulating film may be disposed between the auxiliary gate electrode and the voltage application electrode. The auxiliary gate electrode may be connected to the voltage application electrode through a first contact plug disposed in the interlayer insulating film.

The OLED display apparatus may include a storage capacitor including a lower electrode disposed between the first gate insulating film and the second gate insulating film which may function as a gate of the driving TFT. An upper electrode may be disposed between the second gate insulating film and the interlayer insulating film.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION

Figure 1:
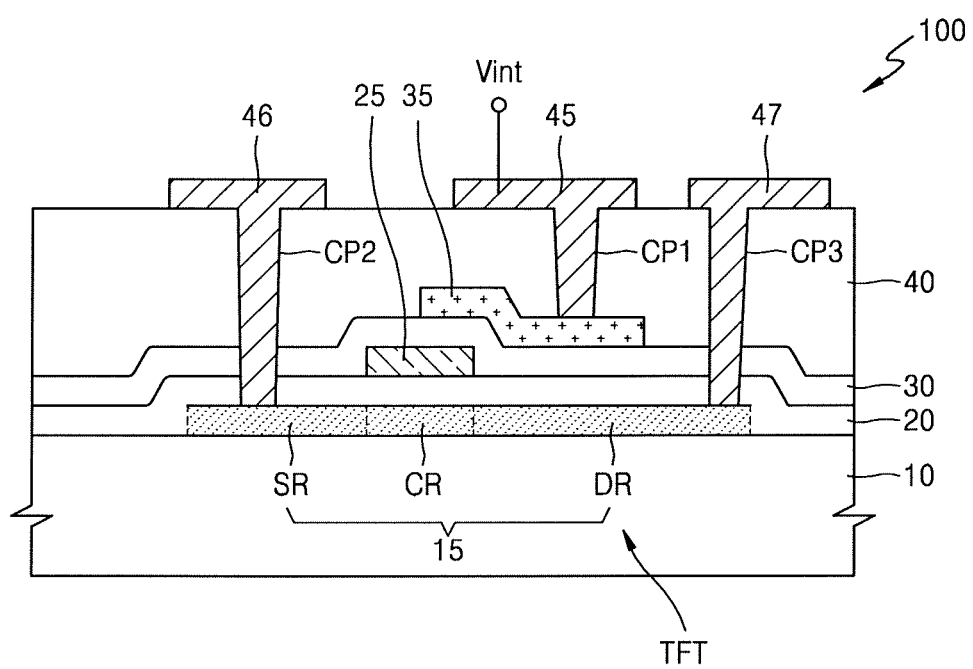
FIG. 1 is a cross-sectional view of a thin film transistor (TFT) substrate according to an exemplary embodiment of the present invention.

The present invention allows for various changes and numerous exemplary embodiments. Exemplary embodiments of the present invention will be described below in more detail with reference to the accompanying drawings. However, exemplary embodiments of the present invention are not limited to the exemplary embodiments described herein and exemplary embodiments of the present invention may be implemented in various forms.

It will be understood that when an element or a layer is referred to as being "on" another element or another layer, the element may be directly on the other element or layer, or intervening elements may be present.

Terms such as "below," "beneath," "lower," "above," and "upper," or other spatially relative terms, may be used to describe a relative position or relationship between one device or component and another device or component. However, exemplary embodiments of the present invention are not limited to a particular position or relationship between devices or components.

While such terms as "first," and "second" may be used to describe various components, such components are not limited to these terms.

Exemplary embodiments of the present invention may be described with reference to ideal schematic plan views and cross-sectional views. The shape of an exemplary view may be transformed by a manufacturing technology and/or a tolerance. Exemplary embodiments of the present invention are not limited to illustrated specific forms but may include changes of a form generated depending on a manufacturing process. Regions illustrated in the drawings may have a schematic attribute, and the shape of regions exemplified in the drawings may illustrate an exemplary shape of a region of a device, and do not limit the scope of the present invention.

Hereinafter, exemplary embodiments of the present invention will be described in more detail with reference to the accompanying drawings. Like reference numerals may refer to like or corresponding elements throughout the specification and drawings.

FIG. 1 is a cross-sectional view of a thin film transistor (TFT) substrate according to an exemplary embodiment of the present invention.

Referring to FIG. 1, a TFT substrate 100 may include a substrate 10, an active layer 15, a gate electrode 25, an auxiliary gate electrode 35, and a voltage application electrode 45. The active layer 15, the gate electrode 25, and the auxiliary gate electrode 35 may be included in the TFT.

The active layer 15 may be disposed on the substrate 10 and may include a source region SR, a channel region CR, and a drain region DR. The gate electrode 25 may be disposed on the channel region CR. The auxiliary gate electrode 35 may be disposed on the gate electrode 25 and may cover a boundary between the channel region CR and the drain region DR. The voltage application electrode 45 may be disposed on the auxiliary gate electrode 35 and may be connected to the auxiliary gate electrode 35. An initialization voltage Vint may be applied to the voltage application electrode 45.

The substrate 10 may support the TFT and may maintain the rigidity of the TFT. The substrate 10 may have a flat upper surface and may include a transparent insulating material. For example, the substrate 10 may include glass. However, exemplary embodiments of the present invention are not limited thereto, and the substrate 10 may include a plastic material, such as polyethersulphone (PES) or polyacrylate (PAR). The substrate 10 may include an opaque material, such as a metal or a carbon fiber. To implement a flexible display apparatus, the substrate 10 may include a flexible plastic such as a polyimide (PI) film.

A buffer film may be disposed on the substrate 10. The buffer film may smooth the upper surface of the substrate 10 and may reduce or prevent the penetration of impurities into the substrate 10. The buffer film may include multiple layers or a single layer including an inorganic material such as silicon oxide ($SiO_x$) and/or silicon nitride ($SiN_x$), and may be formed by using any of various deposition methods.

The active layer 15 may be disposed on the substrate 10. The active layer 15 may include a semiconductor material, for example, amorphous silicon or poly crystalline silicon. However, exemplary embodiments of the present invention are not limited thereto, and the active layer 15 may include an oxide semiconductor material such as $GIZO[(In_2O_3)_a(Ga_2O_3)_b(ZnO)_c]$ (where a, b, and c are real numbers that satisfy a≥0, b≥0, and c>0, respectively). In addition to GIZO, the active layer 15 may include an oxide of a material selected from Group 12, 13, and 14 metal elements, such as zinc (Zn), indium (In), gallium (Ga), tin (Sn), cadmium (Cd), germanium (Ge), and an hafnium (Hf), or a combination thereof.

The active layer 15 may include the source region SR, the drain region DR, and the channel region CR. The channel region CR may be between the source region SR and the drain region DR. When the active layer 102 includes amorphous silicon or poly crystalline silicon, the source region SR and the drain region DR may be doped with impurities. When the TFT is a p-type TFT, the source region SR and the drain region DR may include p-type impurities, such as boron or aluminum. When the TFT is an n-type TFT, the source region SR and the drain region DR may include n-type impurities, such as phosphorus or arsenic. According to exemplary embodiments of the present invention the TFT may be a p-type TFT. However, exemplary embodiments of the present invention are not limited thereto.

The gate electrode 25 may be disposed on the channel region CR. The channel region CR may be substantially a same width as a width of the gate electrode 25. The gate electrode 25 may be connected to a gate line that applies an on/off-signal to the TFT. The gate electrode 25 may include a low resistance metal material, and may include multiple layers or a single layer including a conductive material including, for example, molybdenum (Mo), aluminum (Al), copper (Cu), or titanium (Ti).

A first gate insulating film 20 may insulate the active layer 15 and the gate electrode 25 from each other. The first gate insulating film 20 may be disposed between the active layer 15 and the gate electrode 25. The first gate insulating film 20 may include multiple layers or a single layer including an inorganic material such as $SiO_x$ and/or $SiN_x$.

A second gate insulating film 30 may be disposed on the first gate insulating film 20 and the gate electrode 25. The second gate insulating film 30 may include multiple layers or a single layer including an inorganic material such as $SiO_x$ and/or $SiN_x$. The second gate insulating film 30 may insulate the gate electrode 25 and the auxiliary gate electrode 35 from each other.

The auxiliary gate electrode 35 may be disposed on the second gate insulating film 30 and may cover a boundary between the channel region CR and the drain region DR. The auxiliary gate electrode 35 may include a low resistance metal material, and may include multiple layers or a single layer including a conductive material including, for example, Mo, Al, Cu, or Ti.

An interlayer insulating film 40 may be disposed on the second gate insulating film 30 and the auxiliary gate electrode 35. The interlayer insulating film 40 may include multiple layers or a single layer including an inorganic material. For example, the inorganic material may be metal oxide or metal nitride. The inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZrO_2$). A source electrode 46 and a drain electrode 47 may be disposed on the interlayer insulating film 40, and the interlayer insulating film 40 may insulate the auxiliary gate electrode 35 from the source electrode 46 and the drain electrode 47.

The voltage application electrode 45 may be disposed on the interlayer insulating film 40. The initialization voltage Vint may be applied to the voltage application electrode 45 through an initialization voltage line. The voltage application electrode 45 may be connected to the auxiliary gate electrode 35 through a first contact plug CP1 that passes through the interlayer insulating film 40. The voltage application electrode 45 may include multiple layers or a single layer including a conductive material including, for example, Mo, Al, Cu, or Ti.

The source electrode 46 and the drain electrode 47 may be disposed on the interlayer insulating film 40 and may be connected to the source region SR and the drain region DR, respectively, through a second contact plug CP2 and a third contact plug CP3, respectively, that pass through the interlayer insulating film 40, the second gate insulating film 30, and the first gate insulating film 20. The voltage application electrode 45, the source electrode 46, and the drain electrode 47 may be formed at substantially the same time with the same material.

The initialization voltage Vint may have a negative direct voltage level. The initialization voltage Vint may be applied to the auxiliary gate electrode 35 through the voltage application electrode 45. When the initialization voltage Vint having a negative direct voltage level may be applied to the auxiliary gate electrode 35, the auxiliary gate electrode 35 may apply a negative electric field to the active layer 15, and more particularly, to a boundary between the channel region CR and the drain region DR. The first gate insulating film 20 and the second gate insulating film 30 may be disposed between the auxiliary gate electrode 35 and the active layer 15. When the thickness of the first gate insulating film 20 and the thickness of the second gate insulating film 30 are less than that of the interlayer insulating film 40, an electric field of the auxiliary gate electrode 35 may influence the active layer 15. The sum of the thickness of the first gate insulating film 20 and the thickness of the second gate insulating film 30 may be less than the thickness of the interlayer insulating film 40.

Figure 2:
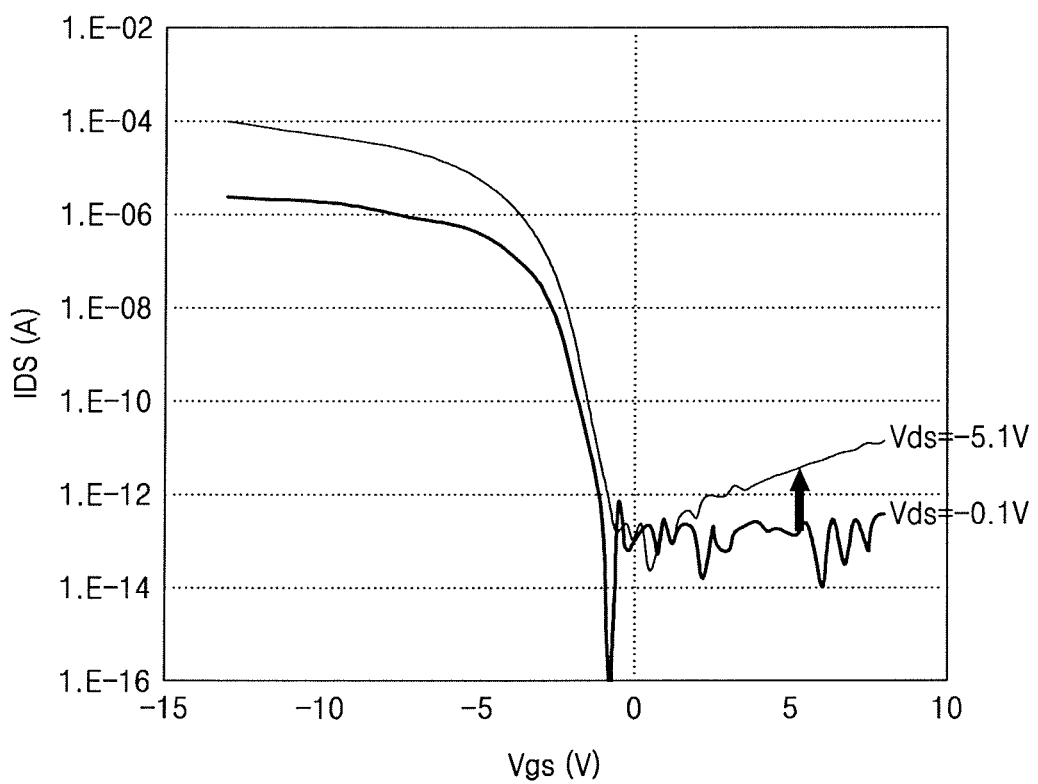
FIG. 2 is a characteristic graph of a TFT according to an exemplary embodiment of the present invention.

FIG. 2 is a characteristic graph of a TFT according to an exemplary embodiment of the present invention.

A drain-source current IDS for a gate-source voltage Vgs of the TFT is shown in FIG. 2. The graph of FIG. 2 is a graph for a p-type TFT. However, exemplary embodiments of the present invention are not limited thereto.

Since the conductive type of the TFT is a p-type, the drain-source current IDS may increase when the gate-source voltage Vgs decreases. When the gate-source voltage Vgs is about 0 volts (V) or more, the drain-source current IDS may decrease to less than $10^{-12}$ ampere (A) and thus the TFT may be turned off. When a drain-source voltage Vds is about −0.1 V, the drain-source current IDS might not increase when the gate-source voltage Vgs increases. When the drain-source voltage Vds is about −5.1 V, the drain-source current IDS may increase to more than $10^{-12}$ A when the gate-source voltage Vgs increases. In this case, the drain-source current IDS may increase in proportion to the gate-source voltage Vgs and may function as an off-leakage current.

When the initialization voltage Vint is applied to the auxiliary gate electrode 35, the auxiliary gate electrode 35 may apply a negative electric field to the active layer 15, and more particularly, to a boundary between the channel region CR and the drain region DR. An electric potential in the boundary between the channel region CR and the drain region DR may be lowered due to an influence of the negative electric field, and thus, an off-leakage current may be reduced or eliminated as when the drain-source voltage Vds is −0.1 V.

Figure 3A:
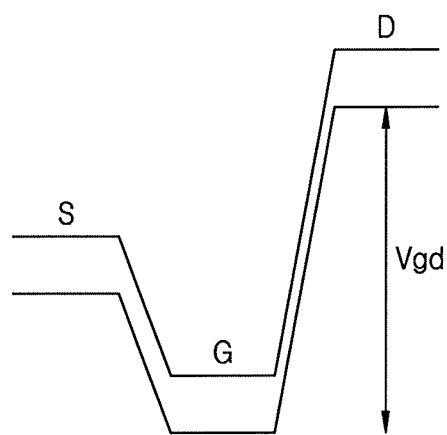
FIG. 3A is a potential graph of a TFT.
Figure 3B:
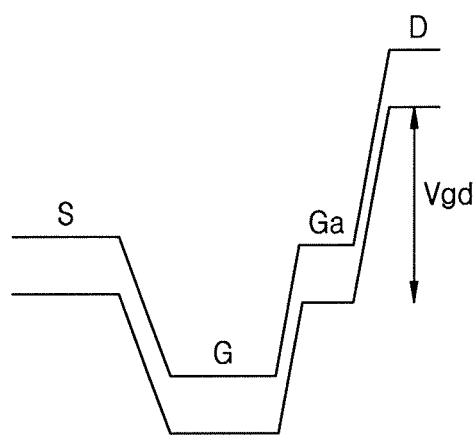
FIG. 3B is a potential graph of a TFT according to an exemplary embodiment of the present invention.

FIG. 3A is a potential graph of a TFT. FIG. 3B is a potential graph of a TFT according to an exemplary embodiment of the present invention.

FIG. 3A illustrates a potential graph of a conventional turned-off p-type TFT, and FIG. 3B illustrates a potential graph of a turned-off p-type TFT according to an exemplary embodiment of the present invention. Referring to FIGS. 3A and 3B, the horizontal axis denotes a source electrode S, a gate electrode G, and a drain electrode D, and the vertical axis denotes a negative potential of the source electrode S, a negative potential of the gate electrode G, and a negative potential of the drain electrode D. The potential of the source electrode S may be 0 V.

Referring to FIGS. 3A and 3B, the gate electrode G may have a higher potential than the source electrode S when the TFT is turned off. When the potential of the drain electrode D is lower than that of the source electrode S, a gate-drain voltage Vgd of the conventional TFT may be relatively high, as shown in FIG. 3A. However, in the TFT according to exemplary embodiments of the present invention, the gate-drain voltage influencing an off-leakage current may be relatively lower, as shown in FIG. 3B, when the initialization voltage Vint is applied to the auxiliary gate electrode 35. Thus, the off-leakage current may be reduced. For example, the off-leakage current may be reduced when the drain-source voltage Vds is about −0.1 V.

Figure 4:
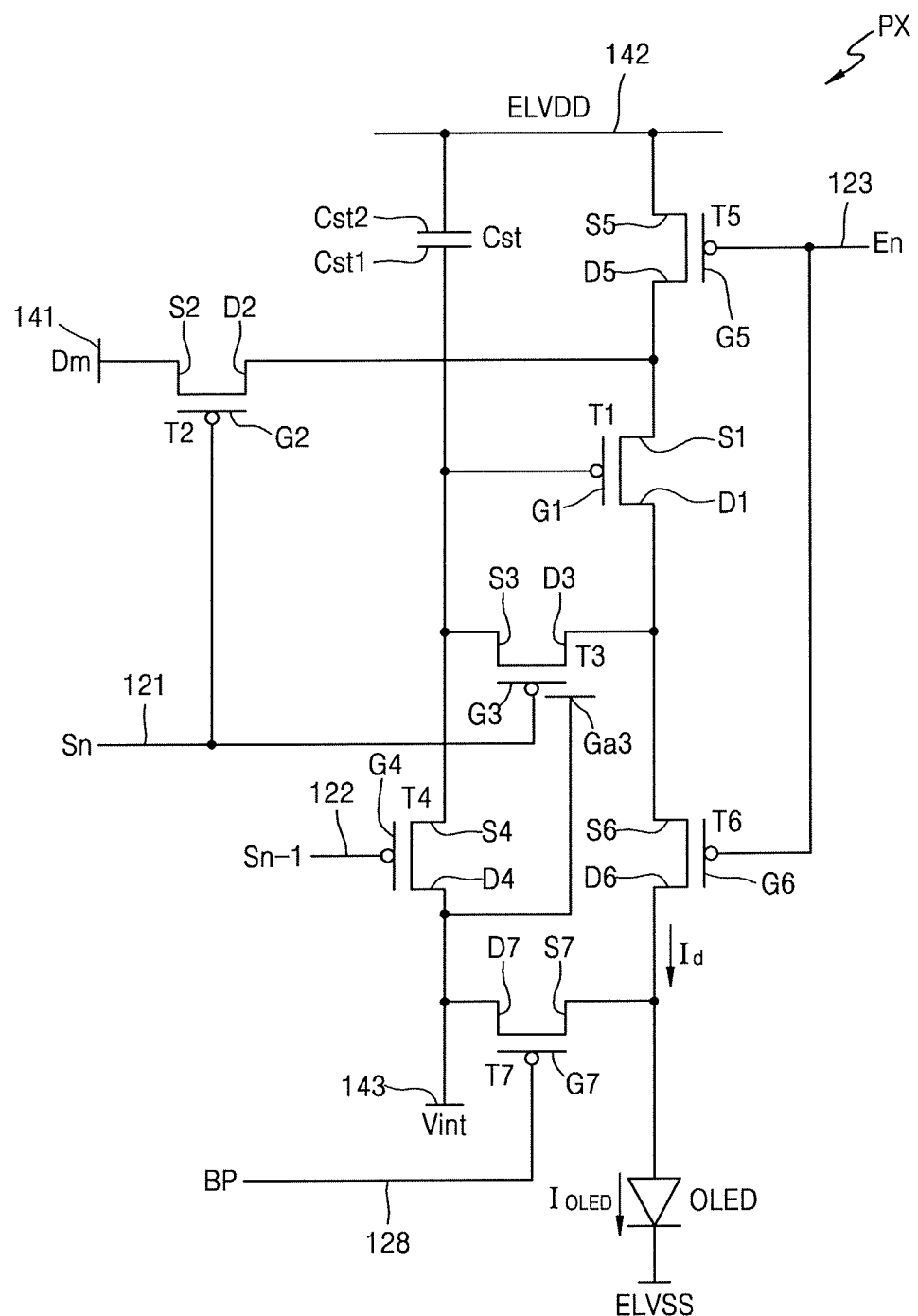
FIG. 4 is an equivalent circuit diagram of one pixel of an organic light-emitting diode (OLED) display apparatus according to an exemplary embodiment of the present invention.

FIG. 4 is an equivalent circuit diagram of one pixel of an organic light-emitting diode (OLED) display apparatus according to an exemplary embodiment of the present invention.

Referring to FIG. 4, a pixel PX may include a plurality of TFTs T1, T2, T3, T4, T5, T6, and T7, which may be connected to a plurality of signal lines 121, 122, 123, 128, 141, 142, and 143, a storage capacitor Cst, and an OLED.

The pixel PX may include a driving TFT T1, a switching TFT T2, and a compensation TFT T3. The pixel PX may include at least one selected from an initialization TFT T4, an operation control TFT T5, an emission control TFT T6, and a bypass TFT T7.

The plurality of signal lines 121, 122, 123, 128, 141, 142, and 143 may include a scan line 121 for transmitting a scan signal Sn to the switching TFT T2 and the compensation TFT T3, a previous scan line 122 for transmitting a previous scan signal Sn-1 to the initialization TFT T4, an emission control line 123 for transmitting an emission control signal En to the operation control TFT T5 and the emission control TFT T6, a bypass control line 128 for transmitting a bypass signal BP to the bypass TFT T7, a data line 141 crossing the scan line 121 and for transmitting a data signal Dm, a driving voltage line 142 for transmitting a driving voltage ELVDD and extending substantially in parallel with the data line 141, and an initialization voltage line 143 for transmitting the initialization voltage Vint to initialize the driving TFT T1.

A gate G1 of the driving TFT T1 may be connected to a first electrode Cst1 of the storage capacitor Cst. A source S1 of the driving TFT T1 may be connected to the driving voltage line 142 via the operation control TFT T5. A drain D1 of the driving TFT T1 may be electrically connected to an anode of the OLED via the emission control TFT T6. The driving TFT T1 may receive the data signal Dm according to a switching operation of the switching TFT T2 and may store the data signal Dm in the storage capacitor Cst through the compensation TFT T3, and may generate a driving current Id corresponding to a voltage stored in the storage capacitor Cst and may output the generated driving current to the OLED.

A gate G2 of the switching TFT T2 may be connected to the scan line 121, and a source S2 of the switching TFT T2 may be connected the data line 141. A drain D2 of the switching TFT T2 may be connected to the source S1 of the driving TFT T1. The switching TFT T2 may be turned on in response to the scan signal Sn that may be transmitted via the scan line 121, and may then transmit the data signal Dm to the source S1 of the driving TFT T1 via the data line 141.

A gate G3 of the compensation TFT T3 may be connected to the scan line 121. A source S3 of the compensation TFT T3 may be commonly connected to the first electrode Cst1 of the storage capacitor Cst, a source S4 of the initialization TFT T4, and the gate G1 of the driving TFT T1. A drain D3 of the compensation TFT T3 may be connected to the drain D1 of the driving TFT T1. The compensation TFT T3 may be turned on in response to the scan signal Sn that may be transmitted via the scan line 121, and may then diode-connect the driving TFT T1 by connecting the gate G1 and the drain D1 of the driving TFT T1 to each other. When the compensation TFT T3 diode-connects the driving TFT T1 when the switching TFT T2 transmits the data signal Dm to the source S1 of the driving TFT T1, a data voltage obtained by compensating for a threshold voltage of the driving TFT T1 may be stored in the storage capacitor Cst.

The compensation TFT T3 may include an auxiliary gate Ga3 connected to the initialization voltage line 143. The auxiliary gate Ga3 may be disposed on a boundary between the gate G3 and the drain D3. The auxiliary gate Ga3 may include an auxiliary electrode that covers a boundary between a channel region and a drain region of the compensation TFT T3. The auxiliary gate ga3 may reduce an off-leakage current by applying a negative electric field to the drain D3 when the compensation TFT T3 is turned off.

A gate G4 of the initialization TFT T4 may be connected to the previous scan line 122. A source S4 of the initialization TFT T4 may be commonly connected to the first electrode Cst1 of the storage capacitor Cst, the source S3 of the compensation TFT T3, and the gate G1 of the driving TFT T1, and the drain D4 of the initialization TFT T4 is connected to the initialization voltage line 143. The initialization TFT T4 may perform an initialization operation in which the initialization TFT T4 is turned on in response to the previous scan signal Sn-1 that may be transmitted via the previous scan line 122, and may then transmit the initialization voltage Vint to the gate G1 of the driving TFT T1 and may thus initialize a voltage of the gate G1 of the driving TFT T1.

A gate G5 of the operation control TFT T5 may be connected to the emission control line 123. A source S5 of the operation control TFT T5 may be connected to the driving voltage line 142, and a drain D5 of the operation control TFT T5 may be commonly connected to the source S1 of the driving TFT T1 and the drain D2 of the switching TFT T2.

A gate G6 of the emission control TFT T6 may be connected to the emission control line 123. A source S6 of the emission control TFT T6 may be commonly connected to the drain D1 of the driving TFT T1 and the drain D3 of the compensation TFT T3. A drain D6 of the emission control TFT T6 may be electrically connected to the anode of the OLED. The operation control TFT T5 and the emission control TFT T6 may be substantially simultaneously turned on in response to the emission control signal En that may be transmitted via the emission control line 123, and the driving voltage ELVDD may be transmitted to the OLED and thus an emission current Ioled may flow to the OLED.

A gate G7 of the bypass TFT T7 is connected to the bypass control line 128, a source S7 of the bypass TFT T7 is commonly connected to the drain D6 of the emission control TFT T6 and the anode of the OLED, and a drain D7 of the bypass transistor T7 is commonly connected to the initialization voltage line 143 and the drain D4 of the initialization TFT T4.

A second electrode Cst2 of the storage capacitor Cst may be connected to the driving voltage line 142, and a common voltage ELVSS may be applied to a cathode of the OLED. Thus, the OLED may emit light by receiving the emission current Ioled from the driving TFT T1, and thus an image may be displayed.

An operation of the pixel of the OLED display apparatus according to an exemplary embodiment of the present invention will be described in more detail below.

During an initialization period, the previous scan signal Sn-1 may be supplied via the previous scan line 122 to the gate G4 of the initialization TFT T4. The initialization TFT T4 may be turned on in response to the previous scan signal Sn-1. The previous scan signal Sn-1 may be applied at a relatively low level. The initialization voltage Vint from the initialization voltage line 143 may be applied to the gate G1 of the driving TFT T1 via the initialization TFT T4, and the driving TFT T1 may be initialized by to the initialization voltage Vint.

The scan signal Sn may be supplied via the scan line 121 during a data programming period. Thus, the switching TFT T2 and the compensation TFT T3 may be turned on in response to the scan signal Sn. The driving TFT T1 may be diode-connected due to the compensation TFT T3 and may be biased in a forward direction. A compensation voltage Dm+Vth, which is obtained by subtracting a threshold Vth (where the threshold Vth has a negative value) of the driving TFT T1 from the data signal Dm supplied from the data line 141, may be applied to the gate G1 of the driving TFT T1.

The driving voltage ELVDD and the compensation voltage Dm+Vth may be applied to both terminals of the storage capacitor Cst, respectively, and a charge that corresponds to a voltage difference (e.g., ELVDD-Dm-Vth) between the terminals of the storage capacitor Cst may be stored in the storage capacitor Cst. When the emission control signal En that is supplied from the emission control line 123 is changed from a relatively high level to a relatively low level, the operation control TFT T5 and the emission control TFT T6 may be turned on in response to the emission control signal En during the emission period.

The driving current Id may be generated due to the voltage difference between the voltage of the gate G1 of the driving TFT T1 and the driving voltage ELVDD, and may then be supplied to the OLED via the emission control TFT T6. A source-gate voltage Vsg of the driving TFT T1 may be maintained at a level of 'ELVDD-(Dm+Vth)' due to the storage capacitor Cst level during the emission period, and according to a current-voltage relation of the driving TFT T1, the driving current Id may be proportional to a square value ($(ELVDD-Dm)^2$) of a value that is obtained by subtracting the threshold voltage Vth from the source-gate voltage Vsg. Thus, the driving current Id may be may be generated regardless of the threshold voltage Vth of the driving TFT T1.

The bypass TFT T7 may receive the bypass signal BP from the bypass control line 128. The bypass TFT T7 may be turned on in response to the bypass signal BP and may thus apply the initialization voltage Vint to the anode of the OLED. During a non-emission period, charges remaining in the anode of the OLED may be discharged through the bypass TFT T7. Thus, when the driving current Id corresponding to a black image flows, the OLED may express an accurate black luminance image and thus may increase a contrast ratio of the OLED.

A structure of the pixel of the OLED display apparatus illustrated in FIG. 4 will be described in more detail below with reference to FIGS. 5 and 6 along with FIG. 4.

Figure 5:
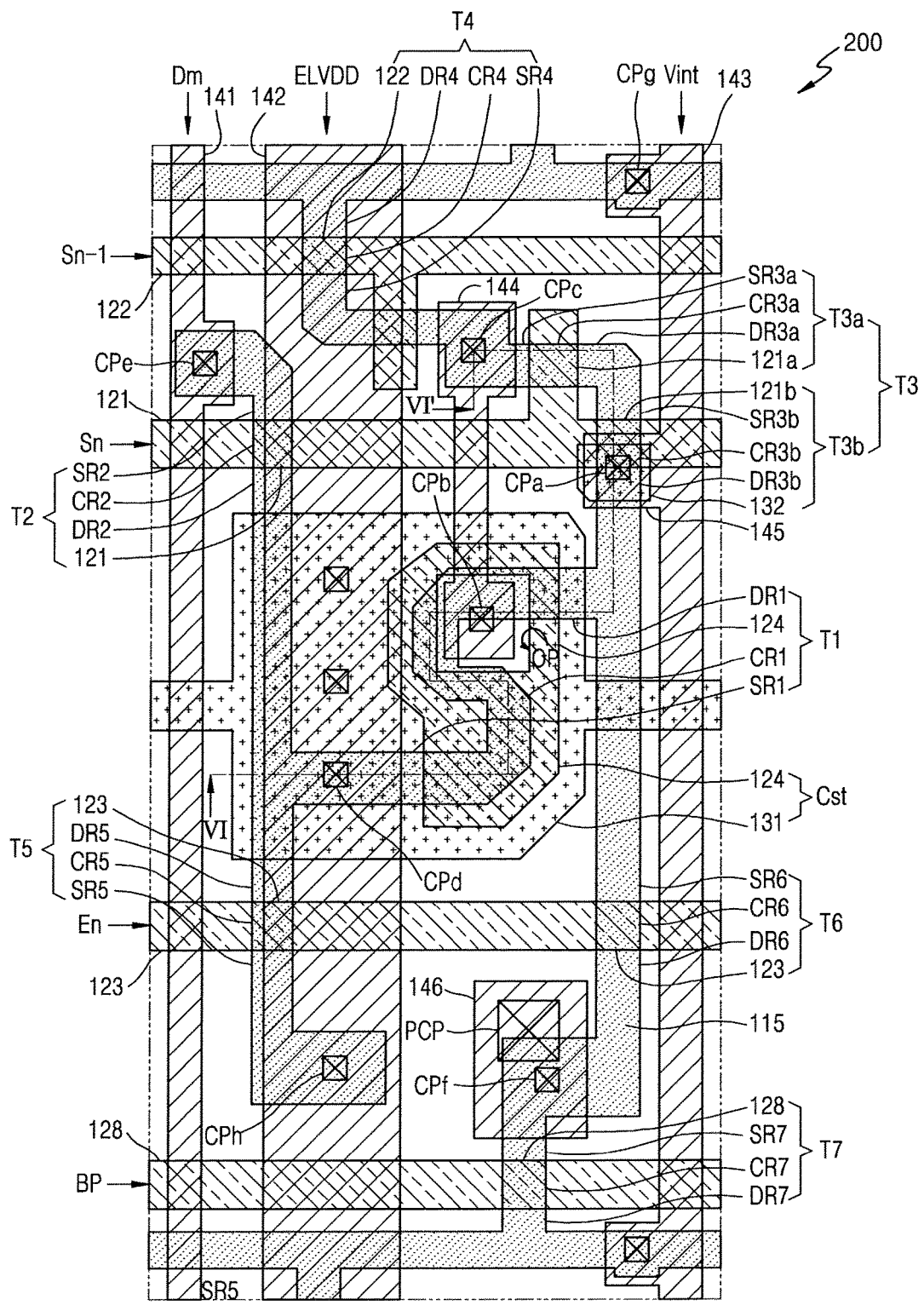
FIG. 5 is a plan view of an OLED display apparatus according to an exemplary embodiment of the present invention.

FIG. 5 is a plan view of an OLED display apparatus according to an exemplary embodiment of the present invention. FIG. 6 is a cross-sectional view taken along a line VI-VI' in the OLED display apparatus of FIG. 5.

Referring to FIG. 5, an OLED display apparatus 200 may include the scan line 121, the previous scan line 122, the emission control line 123, and the bypass control line 128, which may transmit the scan signal Sn, the previous scan signal Sn-1, the emission control signal En, and the bypass signal BP, respectively, which may extend in a row direction. The OLED display apparatus 200 may include the data line 141, the driving voltage line 142, and the initialization voltage line 143, which may intersect the scan line 121, the previous scan line 122, the emission control line 123, and the bypass control line 128 and may apply a data signal Dm, a driving voltage ELVDD, and an initialization voltage Vint, respectively, to the pixel PX.

The pixel PX may include the driving TFT T1, the switching TFT T2, the compensation TFT T3, the storage capacitor Cst, and the OLED. The pixel PX may include at least one selected from the initialization TFT T4, the operation control TFT T5, the emission control TFT T6, and the bypass TFT T7.

The driving TFT T1, the switching TFT T2, the compensation TFT T3, the initialization TFT T4, the operation control TFT T5, the emission control TFT T6, and the bypass TFT T7 may be arranged along an active layer 115. The active layer 115 may be bent in various shapes. The active layer 115 may include polysilicon or oxide semiconductor. The oxide semiconductor may include any one selected from among an oxide including titanium (Ti), hafnium (Hf), zirconium (Zr), aluminum (Al), tantalum (Ta), germanium (Ge), zinc (Zn), gallium (Ga), tin (Sn) or indium (In), and their composite oxides, such as zinc oxide (ZnO), indium-gallium-zinc oxide (InGaZnO4), indium-zinc oxide (Zn—In—O), zinc tin oxide (Zn—Sn—O), indium-gallium oxide (In—Ga—O), indium-tin oxide (In—Sn—O), indium zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium tantalum oxide (In—Ta—O), indium-tantalum-zinc oxide (the In—Zn—Ta—O), indium-tantalum-tin oxide (In—Ta—Sn—O), indium-tantalum-oxide-gallium (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium indium zinc oxide (Hf—In—Zn—O). When the active layer 115 includes an oxide semiconductor, a protective layer may be disposed on the active layer 115 to protect the oxide semiconductor which may be vulnerable to an external environment such as a high temperature.

The active layer 115 may include driving active layers SR1, CR1, and DR1 of the driving TFT T1, switching active layers SR2, CR2, and DR2 of the switching TFT T2, compensation active layers SR3a, CR3a, DR3a, SR3b, CR3b, and DR3b of the compensation TFT T3, initialization active layers SR4, CR4, and DR4 of the initialization TFT T4, operation control active layers SR5, CR5, and DR5 of the operation control TFT T5, emission control active layers SR6, CR6, and DR6 of the emission control TFT T6, and bypass active layers SR7, CR7, and DR7 of the bypass TFT T7.

The driving TFT T1 may include the driving active layers SR1, CR1, and DR1 and a driving gate electrode 124. The driving active layers SR1, CR1, and DR1 include a driving source region SR1, a driving channel region CR1, and a driving drain region DR1, respectively.

The driving channel region CR1 may be bent and may have a meandering shape or a zigzag shape. When the driving channel region CR1 is bent, the channel length of the driving channel region CR1 may be increased. Since the channel length of the driving channel region CR1 may be increased, a driving range of a gate voltage that is applied to the driving gate electrode 124 may be increased. Thus, a gray scale of light that is emitted from the OLED may be minutely controlled by changing the level of the gate voltage, and the resolution of the OLED display apparatus 200 may be increased and the display quality of the OLED display apparatus may be increased. The driving channel region CR1 may have any of various shapes, such as 'reverse S', 'S', 'M', and 'W' shapes, by changing the shape of the driving channel region CR1.

The driving gate electrode 124 may overlap the driving channel region CR1 and may be formed in the same layer as and with the same material as the scan line 121, the previous scan line 122, the emission control line 123, and the bypass control line 128. The driving gate electrode 124 may be connected to a connection pattern 144 via a contact plug CPb.

The switching TFT T2 may include the switching active layers SR2, CR2, and DR2, and a switching gate electrode that is a part of the scan line 121. The switching active layers SR2, CR2, and DR2 may include a switching source region SR2, a switching channel region CR2, and a switching drain region DR2. The switching source region SR2 may be connected to the data line 141 via a contact plug CPe. The switching drain region DR3 may be connected to the driving source region SR1.

The compensation TFT T3 may have a dual gate structure including a first compensation TFT T3a and a second compensation TFT T3b.

The first compensation TFT T3a may include first compensation active layers SR3a, CR3a, and DR3a and a first compensation gate electrode 121a. The first compensation gate electrode 121a may be a part of the scan line 121 or a portion protruding from the scan line 121. The first compensation active layers SR3a, CR3a, and DR3a may include a first compensation source region SR3a, a first compensation channel region CR3a, and a first compensation drain region DR3a. The first compensation source region SR3a may be connected to the connection pattern 144 via a contact plug CPc.

The second compensation TFT T3b may include second compensation active layers SR3b, CR3b, and DR3b and a second compensation gate electrode 121b. The second compensation gate electrode 121b may be a part of the scan line 121. The second compensation active layers SR3b, CR3b, and DR3b may include a second compensation source region SR3b, a second compensation channel region CR3b, and a second compensation drain region DR3b. The second compensation source region SR3b may be connected to the first compensation drain region DR3a. The second compensation drain region DR3b may be connected to the driving drain region DR1.

The second compensation TFT T3b may include an auxiliary gate electrode 132 that covers a boundary between the second compensation channel region CR3b and the second compensation drain region DR3b. The auxiliary gate electrode 132 may be connected to a voltage application electrode 145, which may be a part of the initialization voltage line 143, via a contact plug CPa. The voltage application electrode 145 may be connected to the initialization voltage line 143. The auxiliary gate electrode 132 might not cover a boundary between the second compensation source region SR3b and the second compensation channel region CR3b. The initialization voltage Vint may have a negative direct current (DC) voltage level, and the auxiliary gate electrode 132 may apply a negative electric field to a boundary region between the second compensation channel region CR3b and the second compensation drain region DR3b. Thus, an off-leakage current of the second compensation TFT T3b may be reduced or prevented.

The initialization TFT T4 may include the initialization active layers SR4, CR4, and DR4 and an initialization gate electrode that is a part of the previous scan line 122 or a portion protruding from the previous scan line. The initialization TFT T4 may have a dual gate structure. The initialization active layers SR4, CR4, and DR4 may include an initialization source region SR4, an initialization channel region CR4, and an initialization drain region DR4. The initialization source region SR4 may be connected to the connection pattern 144 via the contact plug CPc. The initialization drain region DR4 may be connected to the initialization voltage line 143 via a contact plug CPg. The initialization voltage Vint may be applied to the initialization drain region DR4.

The operation control TFT T5 may include the operation control active layers SR5, CR5, and DR5 and an operation control gate electrode that is a part of the emission control line 123. The operation control active layers SR5, CR5, and DR5 may include an operation control source region SR5, an operation control channel region CR5, and an operation control drain region DR5. The operation control source region SR5 may be connected to the driving voltage line 142 via a contact plug CPh. The driving voltage ELVDD may be applied to the operation control source region SR5. The operation control drain region DR5 may be connected to the driving source region SR1.

The emission control TFT T6 may include emission control active layers SR6, CR6, and DR6 and an emission control gate electrode that is a part of the emission control line 123. The emission control active layers SR6, CR6, and DR6 may include an emission control source region SR6, an emission control channel region CR6, and an emission control drain region DR6. The emission control source region SR6 may be connected to the driving drain region DR1. The emission control drain region DR6 may be connected to a connection node 146 via a contact plug CPf.

The connection node 146 may be connected to a pixel electrode 161 (see, e.g., FIG. 6) via a pixel contact plug PCP. The pixel electrode 161 may correspond to an anode electrode of the OLED. The connection node 146 may be formed in the same layer as and with the same material as the data line 141, the driving voltage line 142, and the initialization voltage line 143, the connection pattern 144, and the voltage application electrode 145.

The bypass TFT T7 may include the bypass active layers SR7, CR7, and DR7, and a bypass gate electrode that is a part of the bypass control line 128. The bypass active layers SR7, CR7, and DR7 may include a bypass source region SR7, a bypass channel region CR7, and a bypass drain region DR7. The bypass source region SR7 may be connected to the connection node 146 via the contact plug CPf. The bypass drain region DR7 may be connected to the initialization voltage line 143 via a contact plug CPg. The initialization voltage Vint may be applied to the bypass drain region DR7.

The storage capacitor Cst may include a lower electrode (e.g., the driving gate electrode 124) and an upper electrode 131. The upper electrode 131 may be connected to the driving voltage line 142 via a contact plug CPd. The driving voltage ELVDD may be applied to the upper electrode 131. The upper electrode 131 may include an opening OP. The contact plug CPb may connect the driving gate electrode 124 to the connection pattern 144 via the opening OP. The contact plug CPb may be insulated from the upper electrode 131.

A structure of the OLED display apparatus according to an exemplary embodiment of the present invention will be described in more detail below with reference to FIG. 6.

Figure 6:
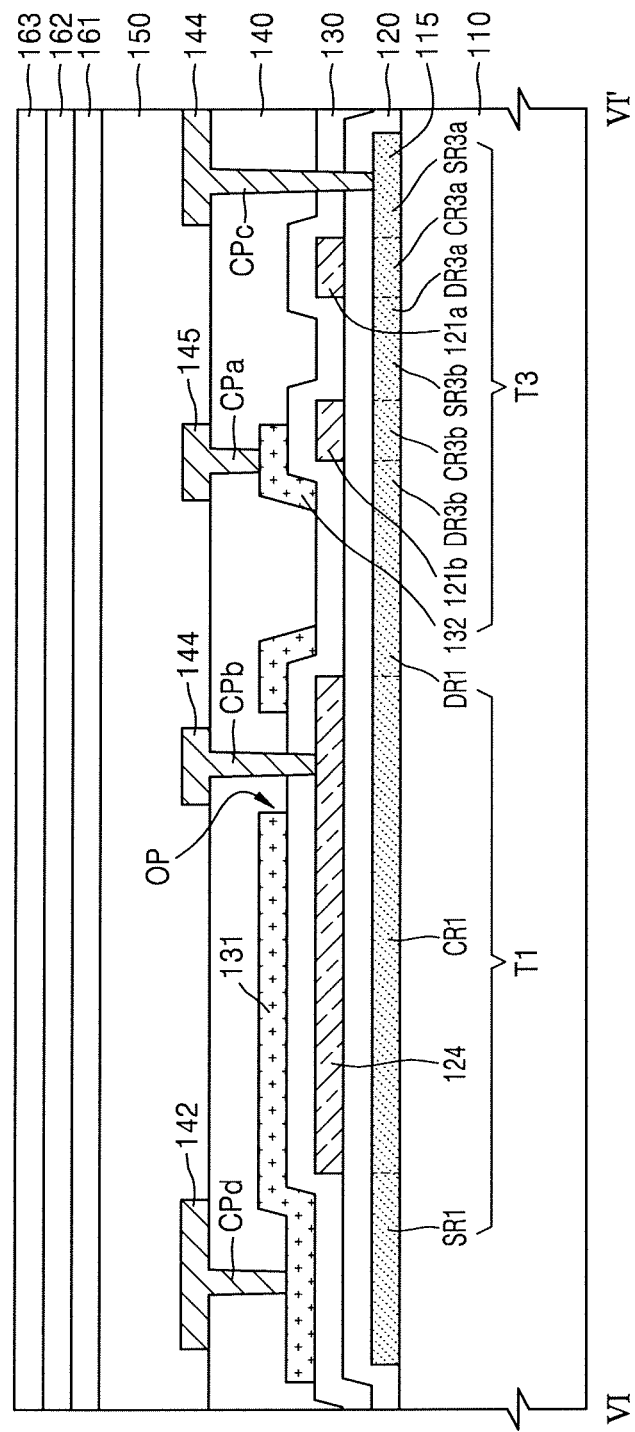
FIG. 6 is a cross-sectional view taken along a line VI-VI' in the OLED display apparatus of FIG. 5.

Structures of the driving TFT T1 and the compensation TFT T3 are illustrated in FIG. 6. Structures of the switching TFT T2, the initialization TFT T4, the operation control TFT T5, the emission control TFT T6, and the bypass TFT T7 may be substantially the same as the structures of the driving TFT T1 and the compensation TFT T3, and duplicative descriptions may be omitted.

A substrate 110 may be an insulating substrate including glass, quartz, ceramic, or plastic. A buffer layer may be disposed on the substrate 110.

An active layer 115 may be disposed on the substrate 110. The active layer 115 may include driving active layers SR1, CR1, and DR1 of the driving TFT T1 and compensation active layers DR3b, CR3b, SR3b, DR3a, CR3a, and SR3a of the compensation TFT T3. The driving active layers SR1, CR1, and DR1 may include the driving source region SR1, the driving channel region CR1, and the driving drain region DR1. The compensation active layers DR3b, CR3b, SR3b, DR3a, CR3a, and SR3a may include the second compensation drain region DR3b, the second compensation channel region CR3b, the second compensation source region SR3b, the first compensation drain region DR3a, the first compensation channel region CR3a, and the first compensation source region SR3a. The driving drain region DR1 may be connected to the second compensation drain region DR3b, and the second compensation source region SR3b may be connected to the first compensation drain region DR3a.

A first gate insulating film 120 may be disposed on the substrate 110 and the active layer 115.

The driving gate electrode 124, the first compensation gate electrode 121a, and the second compensation gate electrode 121b may be disposed on the first gate insulating film 120. The driving gate electrode 124 may overlap the driving channel region CR1. The first compensation gate electrode 121a may overlap the first compensation channel region CR3a. The second compensation gate electrode 121b may overlap the second compensation channel region CR3b. The driving gate electrode 124, the first compensation gate electrode 121a, and the second compensation gate electrode 121b may be substantially simultaneously formed using the same material.

A second gate insulating film 130 may be disposed on the first gate insulating film 120, the driving gate electrode 124, the first compensation gate electrode 121a, and the second compensation gate electrode 121b.

An upper electrode 131 and an auxiliary gate electrode 132 may be disposed on the second gate insulating film 130. The upper electrode 131 may include the opening OP. The opening OP may expose a portion of the driving gate electrode 124. The auxiliary gate electrode 132 may cover a boundary between the second compensation drain region DR3b and the second compensation channel region CR3b. The auxiliary gate electrode 132 might not cover a boundary between the second compensation channel region CR3b and the second compensation source region SR3b.

According to an exemplary embodiment of the present invention, a first auxiliary gate electrode may cover a boundary between the first compensation drain region DR3a and the first compensation channel region CR3a. The first auxiliary gate electrode may be formed at substantially the same time as and may include a same material as the auxiliary gate electrode 132. The initialization voltage Vint may be applied to the first auxiliary gate electrode.

An interlayer insulating film 140 may be disposed on the second gate insulating film 130, the upper electrode 131, and the auxiliary gate electrode 132. The interlayer insulating film 140 may include the contact plugs CPa, CPb, CPc, and CPd.

A driving voltage line 142, the connection pattern 144, and the voltage application electrode 145 may be disposed on the interlayer insulating film 140. The voltage application electrode 145 may be connected to the auxiliary gate electrode 132 via the contact plug CPa. The connection pattern 144 may be connected to the driving gate electrode 124 via the contact plug CPb and may be connected to the first compensation source region SR3a via the contact plug CPc. The driving voltage line 142 may be connected to the upper electrode 131 via the contact plug CPd.

A protective film 150 may be disposed on the interlayer insulating film 140, the driving voltage line 142, the connection pattern 144, and the voltage application electrode 145. The protective film 150 may include the pixel contact plug PCP. The pixel electrode 161 may be disposed on the protective film 150. The pixel contact plug PCP may connect the pixel electrode 161 to the connection node 146. An organic light-emitting layer 162 may be disposed on the pixel electrode 161, and a common electrode 163 may be disposed on the organic light-emitting layer 162. The pixel electrode 161, the organic light-emitting layer 162, and the common electrode 163 may form an OLED.

The pixel electrode 161 may be an anode that is a hole injection electrode, and the common electrode 163 may be a cathode that is an electron injection electrode. However, exemplary embodiments of the present invention are not limited thereto. According to a method of driving the OLED display apparatus according to an exemplary embodiment of the present invention, the pixel electrode 161 may be the cathode and the common electrode 163 may be the anode. Holes may be injected from the pixel electrode 161 into the organic light-emitting layer 162 and electrons may be injected from the common electrode 163 into the organic light-emitting layer 162, and light may be emitted when excitons generated by the combination of the injected holes and the injected electrons fall from an excitation state to the ground state.

The organic light-emitting layer 162 may include a low-molecular weight organic material or a polymer organic material such as poly 3,4-ethylenedioxythiophene (PEDOT). The organic light-emitting layer 162 may include one or more selected from among an emission layer (EML), a hole injection layer (HIL), a hole transporting layer (HTL), an electron transporting layer (ETL), and an electron injection layer (BO. When the organic light-emitting layer 162 includes all of EML, HIL, HTL, ETL and EIL, the HIL may be disposed on the pixel electrode 161 that is a positive electrode, and the HTL, the EML, the ETL, and the EIL may be sequentially stacked on the HIL.

The organic light-emitting layer 162 may include a red EML emitting red light, a green EML emitting green light, and a blue EML emitting blue light. The red EML, the green EML, and the blue EML formed in a red pixel, a green pixel, and a blue pixel, respectively, to display a color image.

In the organic light-emitting layer 162, all of the red EML, the green EML, and the blue EML may be stacked in all of the red pixel, the green pixel, and the blue pixel, and a red color filter, a green color filter, and a blue color filter may be disposed on the red pixel, the green pixel, and the blue pixel, respectively, to display a color image. According to an exemplary embodiment of the present invention, a white EML emitting white light may be formed in all of the red pixel, the green pixel, and the blue pixel, and the red color filter, the green color filter, and the blue color filter may be disposed on the red pixel, the green pixel, and the blue pixel, respectively, to display a color image. When a color image is displayed by using a white EML and a color filter, a deposition mask for forming the red EML, the green EML, and the blue EML in the red pixel, the green pixel, and the blue pixel, respectively, may be omitted.

The white EML may include only one EML, or may have a structure in which a plurality of EMLs is stacked to emit white light. For example, the white EML may have a structure in which at least one yellow EML and at least one blue EML are combined with each other to emit white light, a structure in which at least one cyan EML and at least one red EML are combined with each other to emit white light, or a structure in which at least one magenta EML and at least one green EML are combined with each other to emit white light.

An encapsulation member protecting the OLED may be disposed on the common electrode 163. The encapsulation member may seal the substrate 110 by using a sealant, and may include at least one of various materials, such as glass, quartz, ceramic, plastic, and metal. An inorganic film may be disposed on the common electrode 163 to form a thin film encapsulation layer.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. An organic light-emitting diode (OLED) display apparatus comprising:
    a substrate;
    an initialization voltage line that transmits an initialization voltage;
    a first thin film transistor (TFT) comprising an active layer, a gate electrode, and an auxiliary gate electrode, the active layer being disposed on the substrate and comprising a source region, a channel region, and a drain region, the gate electrode being disposed on the channel region, and the auxiliary gate electrode being disposed on the gate electrode on a boundary between the channel region and the drain region; and
    a voltage application electrode disposed on the auxiliary gate electrode and connected to the initialization voltage line and the auxiliary gate electrode,
    wherein the auxiliary gate electrode receives the initialization voltage being direct current (DC) voltage, and the gate electrode receives a TFT control voltage as a scan signal, the TFT control voltage being different from the initialization voltage.

2. The OLED display apparatus of claim 1, wherein the auxiliary gate electrode is not disposed on a boundary between the channel region and the source region.

3. The OLED display apparatus of claim 1, wherein the first TFT comprises a p-type transistor, and wherein the initialization voltage has a negative direct current (DC) voltage level.

4. The OLED display apparatus of claim 1, further comprising:

a first gate insulating film that insulates the active layer and the gate electrode from each other, the first gate insulating film being disposed between the active layer and the gate electrode;
a second gate insulating film that insulates the gate electrode and the auxiliary gate electrode from each other, the second gate insulating film being disposed between the gate electrode and the auxiliary gate electrode; and
an interlayer insulating film disposed between the auxiliary gate electrode and the voltage application electrode, wherein a first contact plug connecting the auxiliary gate electrode to the voltage application electrode is disposed in the interlayer insulating film.

5. The OLED display apparatus of claim 4, further comprising:
a scan line that transmits the scan signal;
a data line and a driving voltage line which intersect the scan line and transmit a data signal and a driving voltage, respectively;
a switching TFT connected to the scan line and the data line;
a driving TFT comprising a source connected to a drain of the switching TFT, a gate connected to the source region of the first TFT, and a drain connected to the drain region of the first TFT; and
a storage capacitor comprising a lower electrode connected to the gate of the driving TFT and an upper electrode connected to the driving voltage line.

6. The OLED display apparatus of claim 5, wherein the driving TFT is disposed between the first gate insulating film and the second gate insulating film, and wherein the driving TFT comprises a driving gate electrode functioning as the gate of the driving TFT and the lower electrode of the storage capacitor.

7. The OLED display apparatus of claim 5, wherein the lower electrode is disposed between the first gate insulating film and the second gate insulating film, and wherein the upper electrode is disposed between the second gate insulating film and the interlayer insulating film.

8. The OLED display apparatus of claim 5, wherein the gate electrode of the first TFT is connected to the scan line, wherein the first TFT is turned on in response to the scan signal and compensates for a threshold voltage of the driving TFT.

9. The OLED display apparatus of claim 5, further comprising an initialization TFT that is turned on in response to a previous scan signal transmitted via a previous scan line, and transmits the initialization voltage to the gate of the driving TFT.

10. The OLED display apparatus of claim 5, further comprising:
an OLED connected to the drain of the driving TFT and emitting light in response to a driving current output from the driving TFT;
an operation control TFT that is turned on in response to an emission control signal transmitted via an emission control line and transmits the driving voltage to the driving TFT; and
an emission control TFT that is turned on in response to the emission control signal and transmits the driving current from the driving TFT to the OLED.

11. The OLED display apparatus of claim 10, further comprising a bypass TFT that is turned on in response to a bypass control signal transmitted via a bypass control line and transmits the initialization voltage to an anode of the OLED.

12. The OLED display apparatus of claim 5, wherein the initialization voltage line intersects the scan line, and wherein the initialization voltage line is disposed in a same layer as the data line and the driving voltage line.

13. A thin film transistor (TFT) substrate comprising:
a substrate;
an active layer disposed on the substrate and comprising a source region, a channel region, and a drain region;
a gate electrode disposed on the channel region, the gate electrode receiving a TFT control voltage as a scan signal;
an auxiliary gate electrode disposed on the gate electrode on a boundary between the channel region and the drain region; and
a voltage application electrode disposed on the auxiliary gate electrode and connected to the auxiliary gate electrode, wherein the voltage application electrode receives an initialization voltage being direct current (DC) voltage, the initialization voltage being different from the TFT control voltage.

14. The TFT substrate of claim 13, further comprising:
a first gate insulating film that insulates the active layer and the gate electrode from each other, the first gate insulating film being disposed between the active layer and the gate electrode;
a second gate insulating film that insulates the gate electrode and the auxiliary gate electrode from each other, the second gate insulating film being disposed between the gate electrode and the auxiliary gate electrode; and
an interlayer insulating film disposed between the auxiliary gate electrode and the voltage application electrode, wherein the auxiliary gate electrode is connected to the voltage application electrode through a first contact plug disposed in the interlayer insulating film.

15. The TFT substrate of claim 14, further comprising:
a source electrode disposed on the interlayer insulating film, wherein the source electrode is connected to the source region through a second contact plug disposed in the first gate insulating film, the second gate insulating film and the interlayer insulating film; and
a drain electrode disposed on the interlayer insulating film, wherein the drain electrode is connected to the drain region through a third contact plug disposed in the first gate insulating film, the second gate insulating film and the interlayer insulating film, and
wherein the source electrode, the drain electrode, and the voltage application electrode comprise a same material.

16. The TFT substrate of claim 13, wherein the auxiliary gate electrode is not disposed on a boundary between the channel region and the source region.

17. The TFT substrate of claim 13, wherein the initialization voltage has a negative direct current (DC) voltage level, and wherein the source region and the drain region comprise p-type impurities.

18. An organic light-emitting diode (OLED) display apparatus comprising:
a substrate;
a scan line that transmits a scan signal;
an initialization voltage line that transmits an initialization voltage being direct current (DC) voltage and being different from the scan signal;
a data line and a driving voltage line which transmit a data signal and a driving voltage, respectively;
a switching thin film transistor (TFT) connected to the scan line and the data line;
a driving TFT connected to the switching TFT;

a compensation TFT connected between a gate of the driving TFT and a drain of the driving TFT, wherein the compensation TFT is turned on in response to the scan signal and compensates a threshold voltage of the driving TFT; and an OLED connected to the driving TFT, wherein the compensation TFT comprises:

an active layer disposed on the substrate and comprising a source region, a channel region, and a drain region;

a gate electrode disposed on the channel region and receiving the scan signal; and an auxiliary gate electrode disposed on the gate electrode and connected to the initialization voltage line to receive the initialization voltage, wherein the auxiliary gate electrode is disposed on a boundary between the channel region and the drain region.

19. The OLED display apparatus of claim 18, further comprising:

a first gate insulating film that insulates the active layer and the gate electrode from each other, the first gate insulating film being disposed between the active layer and the gate electrode;

a second gate insulating film that insulates the gate electrode and the auxiliary gate electrode from each other, the second gate insulating film being disposed between the gate electrode and the auxiliary gate electrode; and an interlayer insulating film disposed between the auxiliary gate electrode and a voltage application electrode, wherein the auxiliary gate electrode is connected to the voltage application electrode through a first contact plug disposed in the interlayer insulating film.

20. The OLED display apparatus of claim 19, further comprising a storage capacitor comprising a lower electrode disposed between the first gate insulating film and the second gate insulating film and functions as a gate of the driving TFT, and an upper electrode disposed between the second gate insulating film and the interlayer insulating film.

* * * * *